United States Patent [19]

Peters

[11] Patent Number: 4,652,463

[45] Date of Patent: * Mar. 24, 1987

[54] PROCESS FOR DEPOSITING A CONDUCTIVE OXIDE LAYER

[75] Inventor: John W. Peters, Malibu, Calif.

[73] Assignee: Hughes Aircraft, Los Angeles, Calif.

[ * ] Notice: The portion of the term of this patent subsequent to Oct. 2, 2001 has been disclaimed.

[21] Appl. No.: 697,682

[22] Filed: Feb. 1, 1985

Related U.S. Application Data

[63] Continuation of Ser. No. 363,311, Mar. 29, 1982, abandoned.

[51] Int. Cl.$^4$ .............................................. B05D 3/06
[52] U.S. Cl. .................... 427/53.1; 427/54.1; 427/85; 427/87; 427/99; 427/126.2; 427/126.3; 427/162; 427/166; 427/255; 427/255.3; 427/255.7; 427/419.2
[58] Field of Search ................... 427/255.3, 255, 53.1, 427/54.1, 82, 85, 86, 87, 99, 108, 109, 126.1, 126.2, 126.3, 162, 164, 166, 255.7, 419.2

[56] References Cited

U.S. PATENT DOCUMENTS

| | | | |
|---|---|---|---|
| 4,206,252 | 6/1980 | Gordon | 427/255.3 |
| 4,265,932 | 5/1981 | Peters et al. | 427/53.1 |
| 4,265,974 | 5/1981 | Gordon | 427/82 |
| 4,267,205 | 5/1981 | Pastor et al. | 427/82 |
| 4,352,834 | 10/1982 | Taketoshi et al. | 427/87 |
| 4,371,587 | 2/1983 | Peters | 427/255.3 |
| 4,409,260 | 10/1983 | Pastor et al. | 427/82 |
| 4,419,385 | 12/1983 | Peters | 427/255.3 |
| 4,474,829 | 10/1984 | Peters | 427/53.1 |

Primary Examiner—Sadie L. Childs
Attorney, Agent, or Firm—Mary E. Lachman; A. W. Karambelas

[57] ABSTRACT

The specification discloses a low-temperature process for depositing a layer of a conductive oxide of a chosen metal, such as tin oxide, on the surface of a substrate while simultaneously avoiding damage to the substrate. The process comprises exposing the substrate to a selected vapor phase reactant containing the chosen metal, such as tetramethyl tin, in the presence of neutral, charge-free oxygen atoms formed in a manner which avoids the generation of charged particles and high energy radiation that would damage the substrate. The oxygen atoms react with the vapor phase reactant to form the conductive oxide, which deposits as a layer on the surface of the substrate. In a preferred process embodiment, the neutral oxygen atoms are photochemically generated. This process is especially useful for depositing a layer of a transparent conductive oxide on the surface of a radiation-hardened device while maintaining the radiation-hardness of the device.

17 Claims, 1 Drawing Figure

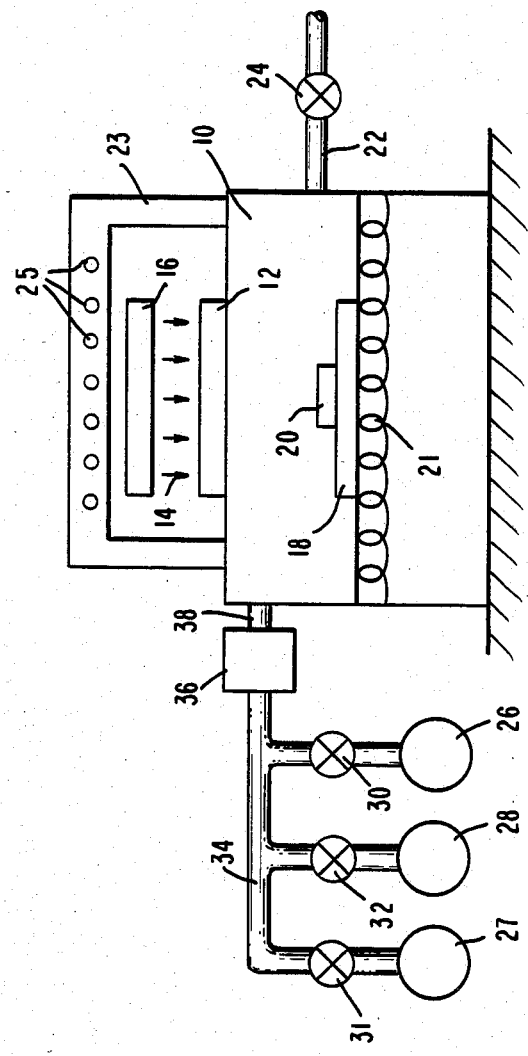

PROCESS FOR DEPOSITING A CONDUCTIVE OXIDE LAYER

This application is a continuation of application Ser. No. 363,311, filed Mar. 29, 1982, now abandoned.

BACKGROUND OF THE INVENTION

1. Field of the Invention

This invention relates generally to the fabrication of semiconductor devices and circuits in which a conductive oxide layer is formed on a substrate surface and, more particularly, to a process for forming such an oxide without causing radiation damage or thermal damage to the substrate on which the oxide layer is formed.

2. Description of the Prior Art

In the fabrication of semiconductor devices and circuits, electrical contact to the active device regions is made through an electrode. The electrode material is characterized by being a good electrical conductor, and certain metals, such as gold, platinum, or aluminum, have been frequently used for this purpose. In addition, certain oxide materials which are electrically conducting have been used as an electrode member. In particular, certain conductive oxides which are also transparent to selected wavelengths of radiation have been useful for establishing electrical contact to the underlying substrate while at the same time allowing radiation to pass through the electrode to the substrate, such as in a front-side illuminated photovoltaic array. These transparent conductive materials are characterized by being both electrically conducting and transparent to selected wavelengths of radiation, as discussed, for example, by G. Haacke, in the publication entitled "Transparent Conducting Coatings," in *Annual Review of Materials Science*, Vol. 7, 1977, pages 73 to 93. In the past, thin films of silver, platinum, and gold were used to form transparent electrodes in photovoltaic and photoconductive cells. More recently, certain transparent conductive oxides, such as tin oxide and indium oxide, have been used for such purposes because of the high transparency, mechanical hardness, and environmental stability of these oxides. These transparent conductive oxides have been found to be especially useful for forming electrode members in semiconductor devices, such as charge-coupled devices, which, in turn, may be formed into a photodetector array. The conductive oxides used as electrodes in the past have been formed as a layer on the surface of a selected substrate, such as silicon, using known procedures, such as sputtering, thermal chemical vapor deposition, or evaporation, as described, for example, by J. L. Vossen in the publication entitled "Transparent Conducting Films", in *Physics of Thin Films*, Vol. 9, 1977, pages 1 to 71, and the references cited therein.

Using a known non-reactive sputtering process, a disk of the selected conductive oxide material, such as tin oxide ($SnO_2$), is bombarded in a reaction chamber with inert ions, such as argon ions, which cause the $SnO_2$ to vaporize from the target (disk); and the vaporized $SnO_2$ subsequently deposits on the selected substrate. Using a known reactive sputtering process, a disk of the selected metal, such as tin, is bombarded in a reaction chamber with oxygen ions, which causes vaporization of the tin from the target, and the vaporized tin and oxygen ions then react to produce the desired oxide, which deposits on the substrate. In both the reactive and the non-reactive sputtering processes, the bombarding ions are formed by subjecting the chosen bombarding material, such as oxygen or argon, respectively, to a radio frequency (rf) or direct current (dc) discharge. However, as a result of the exposure of the chosen bombarding material to discharge, numerous extraneous ionized and neutral particles and high energy radiation with wavelengths as low as 500 angstroms or lower are produced. These extraneous particles then bombard the surface of the substrate on which the oxide is being formed and cause damage thereto by altering the quantity and distribution of charge therein. In addition, the bombardment of the substrate surface by these particles causes the formation of additional charged particles and radiation, which may also damage the substrate. This alteration in the charge of the substrate undesirably alters the electrical performance of the substrate and any structures formed therein. The damage produced by charge bombardment and radiation bombardment is particularly noticeable when the substrate comprises an electrically sensitive device, such as a charge coupled device or a device formed of certain compound semiconductor materials, such as mercury cadmium telluride, indium antimonide, or gallium arsenide.

Using a known thermal chemical vapor deposition (CVD) process for forming an oxide layer, a metalorganic compound, such as dibutyl tin acetate or indium acetylacetate, is thermally decomposed at the heated substrate surface to produce the desired tin oxide or indium oxide, respectively. However, such thermal CVD processes typically employ temperatures in excess of 500° C., which are not compatible with certain temperature-sensitive compound semiconductor materials, such as mercury cadmium telluride, which undergo decomposition at elevated temperatures.

Using a known evaporation process to form an oxide layer, a source comprising the selected oxide, such as tin oxide, is placed in a reaction chamber and is raised to an elevated temperature sufficient to cause evaporation of the oxide, which subsequently deposits on the selected substrate. Alternatively, a known reactive evaporation process may be used in which a metal source is evaporated and the evaporant is reacted with oxygen at the substrate surface. However, the conductive oxide films formed by evaporation processes generally have poor surface morphology, high defect densities, and poor step coverage, all of which degrade the electrical properties of these oxide films.

The present invention is directed to the alleviation of the above-described prior art problem of imparting damage to sensitive devices due to charge bombardment and radiation bombardment or due to relatively high processing temperatures during the formation of a conductive oxide layer thereon

SUMMARY OF THE INVENTION

With regard to the formation of an oxide layer, I have previously discovered a low-temperature process for depositing an oxide layer on a given substrate which comprises exposing the substrate to a chosen vapor phase reactant in the presence of neutral, charge-free atomic oxygen to produce a reaction between the atomic oxygen and the vapor phase reactant to form the desired oxide, which deposits as a layer on the substrate, as described in U.S. Pat. No. 4,371,587 assigned to the present assignee As a further development, I have discovered that the process of my invention disclosed in U.S. Pat. No. 4,371,587 is particularly well suited for depositing a layer of a conductive oxide on the surface of a substrate while at the same time avoiding substrate damage The general purpose of the present invention is to provide a low temperature process for forming a layer of a high quality conductive oxide on the surface of a substrate, which simultaneously avoids substrate damage due to ionized particles and broadband electromagnetic radiation, as well as avoiding thermal damage to the substrate. This process possesses most, if not all, of the advantages of the above prior art oxide deposition processes, while overcoming their above-mentioned disadvantages.

I have discovered that the above-described purpose may be accomplished by forming the conductive oxide layer on a chosen substrate by a low temperature process in which the substrate is exposed to a vapor phase reactant containing a chosen metal in the presence of neutral, charge-free atomic oxygen, which is formed in a manner that avoids the generation of charged particles or high energy radiation. The atomic oxygen reacts with the vapor phase reactant to form the conductive oxide, which deposits as a layer on the substrate surface. The use of neutral oxygen atoms avoids damage to the substrate due to charge bombardment or radiation bombardment and the process is conducted at a relatively low temperature to avoid thermal damage to the substrate.

Accordingly, it is a further purpose of the present invention to provide a new and improved process for forming an oxide layer having good electrical conductivity and, optionally, good optical transmission properties.

Another purpose is to provide a process of the type described in which the radiation hardness of the substrate can be maintained during deposition of the conductive oxide layer thereon.

Yet another purpose is to provide a process of the type described in which the temperature is sufficiently low so as to avoid thermal damage to a temperature-sensitive substrate.

A further purpose is to provide a process of the type described which produces a high quality conductive oxide reproducibly and with high yield.

Another purpose is to provide a process of the type described which is performed at a temperature as low as room temperature (e.g. 30° C.) and thus eliminates the problem of boundary migration and the resulting decreased device yields which are encountered in the fabrication of high density/high speed devices at higher temperatures.

Yet another purpose of the present invention is to provide a process of the type described which produces dense, non-granular, adherent conductive oxide films on selected substrates.

Another purpose of the present invention is to provide a new and improved process for depositing a layer of a chosen conductive oxide containing a selected dopant material on the surface of a substrate by a chemical vapor deposition process which avoids damage to the substrate due to charge bombardment or radiation bombardment.

A feature of the present invention is that a low-temperature photochemical vapor deposition process may be used to form the above-described oxide layer.

The foregoing and other advantages and features of the present invention will become more readily apparent from the following more particular description of the preferred embodiments of the invention, as illustrated in the accompanying drawing.

BRIEF DESCRIPTION OF THE DRAWING

The figure illustrates, in schematic form, a preferred apparatus which may be adapted for carrying out the processes according to various embodiments of the present invention, in which neutral oxygen atoms are formed by either the mercury photosensitized or the direct dissociation of an oxygen-containing precursor, and are reacted to form either an undoped or a doped oxide layer

DETAILED DESCRIPTION OF THE INVENTION

The figure shows, in simplified form, an apparatus suitable for implementation of two process embodiments of the present invention in which neutral oxygen atoms are formed by the mercury photosensitized dissociation of a chemically unreactive oxygen-containing precursor, such as nitrous oxide ($N_2O$), molecular oxygen ($O_2$) under selected pressure and flow rate conditions, or nitrogen dioxide ($NO_2$). (The term "chemically unreactive" is used herein to denote that a substance will not react with the designated reactants under normal mixture conditions.) A reaction chamber 10, in which the chemical vapor deposition reaction occurs, is provided with a quartz window 12, which is integral with the top surface of the reaction chamber 10. The quartz window 12 is transmissive to the selected wavelength of radiation used to initiate the desired photochemical reaction to be discussed below. This radiation 14 of a selected wavelength is produced by the radiation producing means 16, which may be, for example, an array of low pressure mercury vapor arc lamps. Within the reaction chamber 10, there is a substrate holder 18, which receives a substrate 20 onto which the desired oxide layer is to be deposited. The substrate 20 may be a semiconductor material having electronic structures formed therein and optionally having an insulator or passivation layer formed on the surface thereof, such that the conductive oxide of the present invention is formed on top of the insulating layer. Alternatively, the substrate 20 may comprise an electro-optical component or element, such as a lens or mirror, or a body of a chosen material, such as a plastic material, on which the conductive oxide is deposited.

External to the reaction chamber 10 and adjacent to the bottom surface thereof, there are heating elements 21, which may be formed, for example, of Nichrome wire and are activated by applying a controlled voltage thereto. The heating elements 21 may be used optionally to heat the substrate 20 to the required temperature so that appropriate properties of the deposited layer, such as density, may be obtained. The temperature in the chamber 10 may be maintained as low as room temperature (e.g., 30° C.) or as high as required (e.g., 300° C. or higher). However, since mercury vapor arc lamps, for example, become less efficient at increased temperatures, it is necessary to provide external water cooling or an external air or nitrogen cooling source to cool these lamps and remove radiant heat produced by the substrate and substrate holder 18 at certain elevated temperatures (as high as 600° C., for example, or higher) For this purpose, the radiation-producing means 16 is completely contained within the enclosure 23, which may be formed of aluminum, and an external cooling means 25, such as pipes with water flowing therethrough as shown in the figure or flowing nitrogen gas, is activated to apply cooling to the enclosure 23. The enclosure 23 is secured to the outside surface of the reaction chamber 10 which surrounds the quartz window 12, but may be removed therefrom as required. Thus, the processing temperature is maintained at a level such that sufficient cooling of the mercury lamps 10 can be accomplished in order to provide efficient lamp performance. The enclosure 23 also provides eye protection to the operator from the radiation 14. Leading from the reaction chamber 10, there is a tube 22 which passes through a valve 24 and then to a vacuum-producing means, such as a pump (not shown), which is used to evacuate the chamber 10 to a sufficiently low pressure to allow the vapor deposition reaction to occur.

External to the reaction chamber 10, there are the chambers 26 and 28 which contain the individual reactant gases for the selected chemical vapor deposition reaction, for example, tetramethyl tin and nitrous oxide. The chambers 26 and 28 are connected to the control valves or flowmeters 30 and 32, respectively, which are used to control the amounts of reactants which are introduced into a tube 34. Alternatively, for second and fourth process embodiments of the present invention (discussed below), there are included a third chamber 27, which contains the precursor of a selected dopant material, such as stibine, and a corresponding control valve or flowmeter 31, which controls the amount of dopant precursor introduced from the chamber 27 into the tube 34, where it is mixed with the other reactant gases discussed above.

The reactant gases flow through the tube 34 into a chamber 36 which contains a pool of mercury (at room temperature) having mercury vapor above it, at a vapor pressure of $10^{-3}$ Torr at 30° C. The reactant gases thus become mixed with mercury vapor in the chamber 36 and this reactant gas mixture then passes through a tube 38 and into the reaction chamber 10, where the chemical vapor deposition reaction may be brought about. The components of the apparatus shown in the figure may be constructed of stainless steel or aluminum, unless otherwise specified. The apparatus shown in the figure may be used for either a low pressure continuous flow photochemical reactor system, in which there is a continuous influx of reactant gases and removal of reaction by-products during the photochemical reaction process, or for a static photochemical reactor system, in which specified amounts of reactants are introduced into the reaction chamber, the flow of reactant gases is stopped, and then the photochemical reaction process is allowed to occur.

In practicing the present invention in accordance with the first embodiment thereof, which depends on the photochemical generation of atomic oxygen, and using the apparatus of the figure with only two reactant gas chambers (e.g., the chambers 26 and 28), a chemical vapor deposition process is performed as generally described by Werner Kern and Richard S. Rosler in the publication entitled, "Advances in Deposition Processes for Passivation Films", in the *Journal of Vacuum Science and Technology*, Vol. 14, No. 5, September-October 1977, pp. 1082-1099, in the discussion of low pressure chemical vapor deposition processes. The reaction chamber 10 is evacuated by the vacuum-producing means to a predetermined pressure, for example, 1 to 4 Torr. (This operating pressure is selected to maximize the mean free path and lifetime of the reactants in order to produce an oxide with good morphology and good step coverage) The selected vapor phase reactant, such as tetramethyl tin [$Sn(CH_3)_4$], is placed in a chamber such as the chamber 26, and a chemically unreactive oxygen-containing precursor, such as $N_2O$, is placed in a chamber such as the chamber 28. The valves 30 and 32 are set so that the reactants from the chambers 26 and 28, respectively, in a predetermined ratio and at a predetermined flow rate may pass into the tube 34 and then into the chamber 36, which contains a pool of mercury. These reactant gases become mixed with mercury vapor in the chamber 36 and pass from the chamber 36 through the tube 38 into the reaction chamber 10, which is maintained at approximately room temperature (e.g. 30° C.) or up to 200° C. or higher. The reaction temperature is chosen to maximize the quality of the deposited oxide, while at the same time minimizing thermal damage to the substrate, as discussed in further detail below. The radiation-producing means 16 is activated and produces the radiation of a selected wavelength required to produce the desired photochemical reaction (e.g. 2537Å to produce mercury in an excited state). The radiation 14 passes through the quartz window 12 into the reaction chamber 10, where it excites the mercury (Hg) atoms in the reactant gas mixture to form mercury atoms in an excited state (Hg*), which is approximately 5 electrons volts above normal ground state, but unionized, as shown in Equation (1) below. The Hg* then collides with the oxygen-containing precursor, such as $N_2O$, and causes the precursor to dissociate and produce atomic oxygen (O), as shown in Equation (2a) below.

In addition, the Hg* may react with the selected vapor phase reactant, such as $Sn(CH_3)_4$ to produce a charge-free reactive radical, such as a trimethyl tin radical or a dimethyl tin radical, the former being shown in Equation (2b) below. Finally, the atomic oxygen reacts with the reactant, $Sn(CH_3)_4$, or the reactive radical thereof, to produce the desired oxide, such as tin oxide ($SnO_2$) as shown in Equations (3a) and (3b) below. The reactant gas ratio is controlled so that there is no excess tin, in order to avoid the formation of a tin-rich $SnO_2$. The by-products of the reactions of Equations (3a) and (3b) comprise hydrocarbon volatiles, such as ethane, dimethyl ether, and higher alkanes.

$$Hg + h\nu(2537Å) \rightarrow Hg^* \quad (1)$$

where
h = Planck's constant
$\nu$ = frequency of absorbed radiation

$$Hg^* + N_2O \rightarrow N_2 + O + Hg \quad (2a)$$

$$Sn(CH_3)_4 + Hg^* \rightarrow .Sn(CH_3)_3 + .CH_3 + Hg \quad (2b)$$

$$Sn(CH_3)_4 + O \rightarrow SnO_2 + \text{By-products} \quad (3a)$$

$$.Sn(CH_3)_3 + O \rightarrow SnO_2 + \text{By-products} \quad (3b)$$

The reaction of Hg* with $Sn(CH_3)_4$ to form the radicals thereof as shown in Equation (2b) is a side reaction which is not necessary to the process of the present invention, but leads to the same end product as the major reaction path shown in Equations (1), (2a), and (3a). As indicated previously, the atomic oxygen produced in Equation (2a) above may react directly with the selected vapor phase reactant as described in Equation (3a) above, without first forming an intermediate radical.

Alternatively, the atomic oxygen required for this first process embodiment of the present invention may be formed by the mercury sensitized dissociation of nitrogen dioxide ($NO_2$) to form atomic oxygen and NO. The required atomic oxygen may also be formed by the mercury sensitized dissociation of molecular oxygen in accordance with the Equations (4) and (5) below, or by other known means for forming atomic oxygen from an oxygen-containing precursor by photochemical processes. Since molecular oxygen reacts readily with certain materials by thermal combustion, it is necessary to inhibit such a thermal reaction in order to permit the formation of atomic oxygen as required in the process of the present invention. This inhibition is accomplished by controlling the operating pressure and the ratio or flow rates of the reactant gases, as illustrated in Example 2 herein. By controlling such process parameters, the thermal oxidation process by molecular oxygen may be prevented and oxidation by atomic oxygen in accordance with the present invention may occur without competing processes.

$$Hg + h\nu(2537\text{Å}) \rightarrow Hg^* \qquad (4)$$

$$Hg^* + O_2 \rightarrow 2O + Hg \qquad (5)$$

The selected vapor phase reactant used in the process of the present invention comprises a volatile compound containing the metal or cation whose oxide is being formed and which is capable of being oxidized by atomic oxygen as described herein. Some suitable metal-containing vapor phase reactants are a methyl compound or other alkyl or alkoxy compound, or a chloride compound or other halide compound. Tin oxide is deposited by the process of the present invention using a tetramethyl tin reactant, as previously discussed, or a tin chloride ($SnCl_4$) reactant. Indium oxide is deposited using a trimethyl indium reactant; and indium tin oxide is deposited using tetramethyl tin and trimethyl indium reactants in predetermined proportions. Cadmium oxide may be deposited using a dimethyl cadmium reactant; and cadmium orthostannate may be deposited using dimethyl cadmium and tetramethyl tin reactants in predetermined proportions. Iron oxide may be deposited using an iron carbonyl reactant; and titanium oxide may be deposited using a titanium tetrachloride or tetraethoxy titanium reactant. Other conductive oxides may be deposited by the process of the present invention using similar vapor phase reactants which contain the desired metal or cation and which can be oxidized by atomic oxygen as described herein.

By the above-described process of the present invention, oxygen atoms are produced by a photochemical process which generates only neutral, charge-free particles The term "oxygen atom" or "atomic oxygen" is used herein to designate an oxygen atom which is a neutral free-radical having unbonded electrons in its outer electron shell The presence of these unbonded electrons causes the oxygen atom to be highly reactive, to try to gain two more electrons and form a stable, completed outer electron shell. The term "atomic oxygen" is to be distinguished from "molecular oxygen" (alternately referred to herein as "oxygen" or "$O_2$") which is diatomic and consists of two oxygen atoms joined together by a double bond so that each oxygen atom has its full complement of eight electrons in the outer electron shell to form a stable structure. In addition to being neutral (un-ionized) and charge-free, the atomic oxygen used in the present invention is formed in a benign manner which avoids the generation of charged particles or high energy radiation that may damage the substrate or the interface between the substrate and the deposited oxide. Thus, the process of the present invention is charge-free since it is an electrically neutral process which generates no positive or negative particles or ions, or free electrons. Consequently, the process of the present invention avoids the previously discussed prior art problem of substrate damage due to bombardment by charged particles or high energy radiation. It is intended to include within the scope of the present invention not only photochemically generated neutral atomic oxygen, but also any neutral, charge-free oxygen atoms formed in a manner which avoids the generation of charged particles or high energy radiation.

The problem of substrate damage due to charge-bombardment or radiation-bombardment is particularly important when processing radiation-hardened devices (i.e. devices which are required to be resistant to damage by gamma radiation, such as for use in space applications). When certain solid materials are subjected to gamma radiation, electrons are ejected from their normal position and become trapped in the various structural defects of the crystal lattice or network of the material. This latter effect alters the electrical properties of the material such that device performance is degraded. By the very nature of some prior art processes for oxide deposition previously discussed, dangling bonds or charge traps are created in the substrate or at the interface between the deposited oxide and the substrate due to charge-bombardment or radiation-bombardment. If the substrate comprises, for example, a semiconductor material with a passivation layer thereon, charge damage may be produced in both the semiconductor material and the passivation layer by these prior art processes for oxide deposition. These dangling bonds or traps normally increase the probability of radiation damage to the device since they provide sites for entrapment of ejected electrons. As discussed above, the process of the present invention is charge-free and the formation of charge traps in the oxide or at the oxide/substrate interface is minimized. Consequently, the process of the present invention is capable of maintaining the radiation-hardness of a device during oxide deposition. Moreover, it is known that at increased temperatures, structural defects are more likely to be produced in a device being processed, which, in turn, would increase the susceptibility of the device to radiation damage. The process of the present invention overcomes this latter problem by using a low processing temperature, such as 30° to 300° C. Thus, the process of the present invention maintains the radiation hardness of a given device both because of the charge-free nature of the process and because of the low processing temperature. In addition, because of the low processing temperature of the present invention, this process is especially well suited for forming a conductive oxide layer on a temperature-sensitive compound semiconductor material (such as mercury cadmium telluride, indium antimonide, or gallium arsenide) or on a temperature-sensitive plastic material (such as a polycarbonate, an acrylic, or a polyimide).

Moreover, the problem of boundary migration has been eliminated since the process of the present invention can be conducted at a relatively low temperature, i.e. as low as room temperature, and the associated problem of decreased device yield encountered in the high temperature fabrication of high density devices such as a very large scale integrated circuits and very high speed integrated circuits, has been avoided.

Further, the process of the present invention is highly reproducible, reliable, and capable of a high degree of control over the oxide growth process by, among other things, controlling the initiating radiation for the photochemical reaction. Finally, the conductive oxide layer formed by the process of the present invention has excellent morphological characteristics and visible transmission characteristics and is dense, non-granular, durable, and strongly adherent to a variety of substrate surfaces, as discussed in detail in Example 1 herein.

The transparent conductive oxide layers formed by the process of the present invention are useful as transparent electrodes for a photoconductor or photovoltaic array, particularly one comprising radiation-hardened charge-coupled devices When used to provide an electrode, the transparent conductive oxide material may be deposited as a continuous layer and subsequently preferentially etched in a predetermined pattern using photolithographic procedures which are known in the art. Alternatively, the transparent conductive oxide material may be deposited in a predetermined pattern using a mask at the substrate surface or by using focused initiating radiation which strikes only selected portions of the substrate, as described in U.S. Pat. No. 4,265,932, assigned to the present assignee. In addition, transparent conductive oxides of the present invention are useful for providing a transparent conductive contact to a temperature-sensitive plastic substrate, such as to provide a heating element on aircraft windows for deicing and defogging or antistatic coatings on instrument panels. Further the transparent conductive oxides of the present invention may be used to form electrodes in liquid crystal displays, imaging devices, or solar cells. Such oxides may also be used for other purposes such as infrared reflectors, thin film resistors, or a stable, scratch-resistant coating. Moreover, certain non-transparent conductive oxides, such as iron oxide and titanium oxide, may be deposited by the process of the present invention, as previously mentioned. Iron oxide, comprising a composite of FeO and Fe$_2$O$_3$, is useful as a pH meter electrode, while oxygen-deficient titanium oxide exhibits a temperature-sensitive conductivity and is useful as a temperature sensor.

Furthermore, in accordance with a second process embodiment of the present invention, there may be deposited a conductive oxide layer comprising an oxide material, such as tin oxide, having a chosen dopant, such as antimony, incorporated therein to produce the desired electrical conductivity in the oxide, as discussed, for example, by J. L. Vossen, previously referenced herein, at pages 10 to 12 therein. This second process embodiment of the present invention may be performed by practicing the present invention as described above, using the apparatus of the figure with three reactant gas chambers (i.e. the chambers 26, 27, and 28). The selected vapor phase reactant, such as Sn(CH$_3$)$_4$, is exposed to simultaneously formed and photochemically generated neutral oxygen atoms and neutral atoms or molecular fragments of the selected dopant, such as antimony-containing radicals. The neutral atomic and molecular particles are produced by the mercury photosensitized dissociation of a chemically unreactive oxygen-containing precursor, such as nitrous oxide (N$_2$O) and a chemically unreactive dopant-containing precursor, such as stibine (SbH$_3$); which results in the generation of atomic oxygen and neutral stibinyl radicals, respectively, as shown in Equations (6) through (8) below. The atomic oxygen and stibinyl radicals subsequently react with the Sn(CH$_3$)$_4$ to form antimony-doped tin oxide (Sb:SnO$_2$) as shown in Equation (9) below. The by-products noted in Equation (9) comprise hydrocarbon volatiles, as previously discussed.

$$Hg + h\nu(2537\text{Å}) \rightarrow Hg^* \qquad (6)$$

$$Hg^* + N_2O \rightarrow N_2 + O + Hg \qquad (7)$$

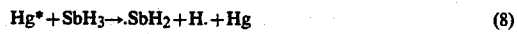

$$Hg^* + SbH_3 \rightarrow .SbH_2 + H. + Hg \qquad (8)$$

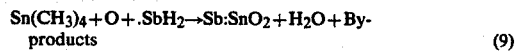

$$Sn(CH_3)_4 + O + .SbH_2 \rightarrow Sb:SnO_2 + H_2O + \text{By-products} \qquad (9)$$

A mechanistic alternative to the sequence described above involves the simultaneous oxidation of both Sn(CH$_3$)$_4$ and SbH$_3$ by atomic oxygen, as indicated in Equations (10) through (12) below. Thus, atomic oxygen alone may be sufficient to bring about the desired reaction as shown in Equation (12) below. Consequently, the production of neutral particles of the selected dopant material as described above in Equation (8) may not be necessary in practicing the second process embodiment of this invention, but may occur.

$$Hg + h\nu(2537\text{Å}) \rightarrow Hg^* \qquad (10)$$

$$Hg^* + N_2O \rightarrow N_2 + O + Hg \qquad (11)$$

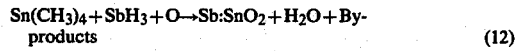

$$Sn(CH_3)_4 + SbH_3 + O \rightarrow Sb:SnO_2 + H_2O + \text{By-products} \qquad (12)$$

The procedure followed to accomplish this second process embodiment of the present invention is essentially as described above with respect to the first process embodiment of this invention, except that additionally, a controlled amount of a selected dopant-containing precursor is introduced from a chamber such as the chamber 27 through the control valve 31 into the tube 34, where it mixes with the reactant gases from the chambers 26 and 28.

Thus, by this second process embodiment of the present invention, a doped conductive oxide film may be deposited by a low-temperature process which avoids the generation of charged particles and high energy radiation and their bombardment damage to the substrate. Additionally, this second process embodiment has all the advantages enumerated above with respect to the formation of an undoped conductive oxide layer by the first process embodiment of the present invention.

In accordance with this second process embodiment of the present invention, other dopants besides antimony may be incorporated in the deposited oxide layer by addition of the corresponding dopant-containing precursor to the reactant gas mixture. For example, tetramethyl tin [$Sn(CH_3)_4$] may be used for tin doping, diborane ($B_2H_6$) may be used for boron doping, arsine ($AsH_3$) may be used for arsenic doping, phosphine ($PH_3$) may be used for phosphorus doping, hydrogen selenide ($H_2Se$) may be used for selenium doping, hydrogen sulfide ($H_2S$) or carbonyl sulfide (COS) may be used for sulfur doping, or hydrogen telluride ($H_2Te$) may be used for tellurium doping. Other dopant-containing precursors which are capable of the mercury photosensitized dissociation reaction of the type discussed herein may also be used. In addition, other conductive oxide materials besides $SnO_2$, which have been discussed with respect to the first process embodiment of the present invention, may be formed as a doped oxide as described herein. For example, tin-doped indium oxide is known to be a good transparent conductive oxide material and may be formed in accordance with the present invention using trimethyl indium and tetramethyl tin in predetermined ratios as the chosen reactants.

In accordance with the third process embodiment of the present invention the required neutral oxygen atoms are formed by a direct photochemical reaction of an oxygen-containing precursor, thus eliminating the need for mercury photosensitization. The apparatus shown in the figure is used except that the chamber 36 which holds the mercury is omitted and only two reactant gas chambers (e.g. chamber 26 and 28) are used.

In practicing the present invention in accordance with the third process embodiment thereof and using the apparatus shown in the figure, omitting the chamber 36 and using only the chambers 26 and 28, the general process described in relation to the first process embodiment of the present invention is followed, except that no mercury is used for photosensitization. The valves 30 and 32 are set so that the reactant gases, such as $Sn(CH_3)_4$ and $N_2O$, from the chambers 26 and 28, respectively, pass in a predetermined ratio and at a predetermined flow rate into the tube 34 and then into the reaction chamber 10. The radiation-producing means 16 is activated and produces the radiation 14 of a selected wavelength, which is the appropriate wavelength to cause the direct dissociation of the selected oxygen-containing precursor (e.g. 1750–1950Å for $N_2O$). The radiation 14 passes through the window 12, which is formed of a material that is transparent to the wavelength of the radiation 14. The radiation 14 passes into the reaction chamber 10, where it causes the dissociation of the selected oxygen-containing precursor, such as $N_2O$, into atomic oxygen, which then reacts with the selected vapor phase reactant, such as $Sn(CH_3)_4$, to form the desired oxide, such as $SnO_2$, as shown in Equations (13) and (14) below. The by-products noted in Equation (14) comprise hydrocarbon volatiles, as previously discussed.

$$N_2O + h\nu(1849\text{Å}) \rightarrow O + N_2 \qquad (13)$$

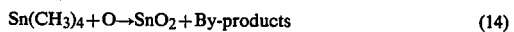
$$Sn(CH_3)_4 + O \rightarrow SnO_2 + \text{By-products} \qquad (14)$$

Alternatively, the atomic oxygen required for this third process embodiment of the present invention may be formed by the direct photochemical dissociation of molecular oxygen as shown in Equation (15) below, or of nitrogen dioxide ($NO_2$) as shown in Equation (16) below, or of similar known materials which are capable of dissociation to atomic oxygen by a direct photochemical process. When a molecular oxygen precursor is used, the operating pressure and reactant gas flow rates must be carefully controlled in order to inhibit any thermal combustion processes, as previously discussed with respect to the first process embodiment of this invention.

$$O_2 + h\nu(1849\text{Å}) \rightarrow 2O \qquad (15)$$

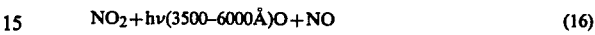
$$NO_2 + h\nu(3500\text{–}6000\text{Å}) O + NO \qquad (16)$$

By the above-described process in accordance with this third embodiment of the present invention, oxygen atoms are generated by a photochemical process which produces only neutral particles. Thus, the previously discussed prior art problems caused by the generation of charged particles and high energy radiation and their bombardment of the substrate have been avoided. The advantages of this third process embodiment of the present invention are the same as those discussed in relation to the first process embodiment previously described. In addition, the process according to this third embodiment has the advantage that no photosensitizing mercury is necessary, and thus possible mercury contamination of the deposited oxide can be avoided. Further, the apparatus for carrying out the process according to this third embodiment is less complex than an apparatus requiring the use of mercury.

Using this third process embodiment of the present invention, there may be deposited a layer of any of the conductive oxide materials discussed above with respect to the first process embodiment of this invention, using the appropriate selected vapor phase metal-containing reactant.

Furthermore, in accordance with a fourth process embodiment of the present invention, there may be deposited on a chosen substrate a conductive oxide layer which incorporates a selected dopant material, by a process which uses the direct photochemical generation of atomic oxygen. The apparatus shown in the figure is used except that the chamber 36 holding the mercury is omitted. The process described above with respect to the third embodiment of this invention is followed except that three reactant gas chambers (e.g. chambers 26, 27, and 28) are used, as described with respect to the second process embodiment of the present invention. To accomplish this fourth process embodiment of the present invention, the selected vapor phase reactant, such as $Sn(CH_3)_4$, is exposed to photochemically generated neutral oxygen atoms in the presence of a dopant-containing precursor, such as stibine ($SbH_3$). The neutral atomic oxygen is produced by direct dissociation of an oxygen-containing precursor, such as $N_2O$, by radiation of a selected wavelength as shown in Equation (17) below. The atomic oxygen then simultaneously oxidizes the $Sn(CH_3)_4$ and $SbH_3$ to form the desired antimony-doped tin oxide as shown in Equation (18) below. The by-products noted in Equation (18) are hydrocarbon volatiles.

$$N_2O + h\nu(1849\text{Å}) \rightarrow O + N_2 \qquad (17)$$

$$Sn(CH_3)_4 + SbH_3 + O \rightarrow Sb:SnO_2 + H_2O + \text{By-products} \quad (18)$$

A possible alternative to the above-described sequence involves the direct dissociation of the dopant containing precursor, such as stibine, to form a neutral stibinyl radical as shown in Equation (19) below. The stibinyl radical so formed and the atomic oxygen formed in accordance with the direct dissociation reaction of Equation (17) above then react with the $Sn(CH_3)_4$ reactant to form the desired antimony-doped tin oxide as shown in Equation (20) below.

$$SbH_3 + h\nu(1849\text{Å}) . SbH_2 + H \quad (19)$$

$$Sn(CH_3)_4 + O + .SbH_2 \rightarrow Sb:SnO_2 + H_2O + \text{By-products} \quad (20)$$

The procedure followed to accomplish the process according to the fourth embodiment of this invention is essentially as described above with respect to the third process embodiment of the present invention, except that additionally a controlled amount of a selected dopant-containing precursor, such as stibine gas, is introduced from the chamber 27 and through the valve 31 into the tube 34, where it mixes with the reactant gases from the chambers 26 and 28.

Thus, by this fourth process embodiment of the present invention, a doped conductive oxide film may be deposited by a low-temperature process which avoids the generation of charged particles and high energy radiation and their bombardment damage to the substrate, and additionally avoids the use of mercury for photosensitization. The significance of these advantages has been discussed above with respect to the third process embodiment of the present invention. Various dopant materials other than stibine may be used and various other conductive oxide materials may be deposited as discussed above with respect to the second process embodiment of the present invention.

EXAMPLE 1

This example illustrates the use of the process according to the first embodiment of the present invention as previously described herein.

Using the apparatus described and illustrated in relation to the figure with two reactant gas chambers, a layer of tin oxide ($SnO_2$) was deposited on the surface a layer of silicon dioxide 0.1 micrometer thick, which was formed on the surface of a wafer of silicon having a three-inch (7.62 centimeter) diameter. Nitrous oxide was used as the oxygen-containing precursor and tetramethyl tin, $Sn(CH_3)_4$, was the selected vapor phase reactant. The reaction chamber 10 was evacuated by the vacuum-producing means to a pressure of $10^{-3}$ Torr, then back-filled with nitrogen, and again evacuated to a pressure of $10^{-3}$ Torr. The flowmeters 30 and 32 were activated to admit the reactant gases in a predetermined ratio into the tube 34 and subsequently into the chamber 36 and the reaction chamber 10, and the reactant gas flow rates were stabilized. The operating pressure within the reaction chamber 10 was adjusted by means of the valve 24 to achieve a pressure of approximately 1 Torr. The heating elements 21 and the cooling means 25 were activated. Finally, the low pressure mercury arc resonance lamps were activated and emitted radiation at 2537Å, which was absorbed by the mercury vapor in the reaction chamber, producing photo-excited mercury atoms, which collided with the nitrous oxide to form atomic oxygen. The atomic oxygen then oxidized the $Sn(CH_3)_4$ to $SnO_2$, which deposited as a layer on the surface of the substrate. When using a continuous flow photochemical reactor system at an operating pressure of 1 Torr, with a reactant gas flow ratio of 1 standard cubic centimeter per minute (sccm) of $Sn(CH_3)_4$ to 25 sccm of $N_2O$, a film of $SnO_2$ was deposited at a rate in excess of 35 angstroms per minute, to a thickness of approximately 3500 angstroms. This $SnO_2$ film was found to be specular, durable (i.e. scratch-resistant), and strongly adherent to the substrate (i.e. passed the known "tape test" for adhesion). In addition, this $SnO_2$ film had excellent morphology, being dense, non-granular, and smooth. The feature sizes (i.e. the diameter of bumps or pits) as seen in a scanning electron micrograph were within the range of 150 to 200Å and produced a smooth morphological surface, which is desirable for optimizing device performance The refractive index of this material was determined by ellipsometry to be 1.9, which is characteristic of $SnO_2$. The sheet resistivity of this $SnO_2$ was determined by using a known four-point probe method and was found to be less than 100 ohms per square, which is comparable to the value obtained for tin oxide formed by prior art processes, as discussed by Haacke, previously referenced herein, at pages 83 and 91 therein. In addition, the $SnO_2$ film formed in accordance with the present invention as described above was found to exhibit good optical transmission properties, having greater than 90 percent transmission of radiation in the range of 0.4 to 1.2 micrometers. The optical transmission was determined by a conventional spectroscopic technique, using a Perkin-Elmer Model 202 UV-Visible Spectrophotometer.

In summary, the $SnO_2$ film formed by the process of the present invention was found to have electrical properties and optical transmission properties which were comparable to those of transparent conductive tin oxide formed by known processes previously discussed. However, the present invention has the advantage over such prior art processes of being able to provide high quality transparent conductive oxides by a benign, charge-free process which avoids charge-damage or radiation-damage to the substrate and which can be performed at a low temperature to avoid thermal damage to the substrate. The significance of these advantages has previously been discussed in detail. Because of the high optical transmission at 0.4 to 1.2 micrometers, the $SnO_2$ films of the present invention are particularly useful as transparent conductive electrodes in radiation-hardened silicon detectors using front-side illumination. It should be noted that the thickness of the deposited conductive oxide may be any value which is consistent with providing a durable and highly conducting electrode.

EXAMPLE 2

Tin oxide films of high quality have also been deposited in accordance with the first process embodiment of the present invention as described above in Example 1, except using molecular oxygen under selected pressure and flow rate conditions, as the oxygen-containing precursor. At an operating pressure of 0.6 Torr and a reactant gas flow ratio of 1 sccm of tetramethyl zinc to 3.6 sccm of oxygen, a film of $SnO_2$ was deposited at the rate of 38Å per minute, to a thickness of 1140Å. The refractive index of the deposited $SnO_2$ was determined by ellipsometry to be 1.63.

EXAMPLE 3

Films of indium oxide ($In_2O_3$) have been deposited in accordance with the first process embodiment of the present invention as generally described above in Example 1, except using trimethyl indium, $In(CH_3)_3$, as the vapor phase metal-containing reactant. Using a reactant gas flow ratio of 1 sccm of $In(CH_3)_3$ to 3.6 sccm of $N_2O$, a film of $In_2O_3$ was deposited to a thickness of 160Å. The refractive index of this deposited $In_2O_3$ was determined by ellipsometry to be 1.90.

In addition, a film of $In_2O_3$ was deposited in accordance with the first process embodiment of the present invention using a static, non-flow system and $In(CH_3)_3$ and $N_2O$ reactants. The $In_2O_3$ film was deposited to a thickness of 195Å and was determined to have a refractive index of 1.54.

EXAMPLE 4

This example illustrates the use of the process in accordance with the third embodiment of the present invention as previously described herein.

Using the apparatus shown in the figure with the chamber 60 being omitted and utilizing two reactant gas chambers, a layer of $SnO_2$ may be deposited on the surface of a layer of silicon dioxide which is formed on the surface of a wafer of silicon. The general procedure described in relation to Example 1 above is followed, except that mercury sensitization is not used. A continuous flow photochemical reactor system is used. The oxygen-containing precursor is $N_2O$, for example, and the selected vapor phase reactant is $Sn(CH_3)_4$. Radiation having a wavelength of 1849Å is used to dissociate the $N_2O$; and the window of the reaction chamber is formed of "spectrosil" (a trademark of Thermal American Fused Quartz, Montville, N.J.), which is transparent to 1849Å radiation. Low pressure mercury arc lamps designed with "spectrosil" envelopes emit radiation at 1849Å, which is transmitted through the "spectrosil" window into the reaction chamber. The radiation is absorbed by the $N_2O$ and causes dissociation thereof to produce atomic oxygen. The atomic oxygen then reacts with the $Sn(CH_3)_4$ to produce the desired $SnO_2$, which deposits as a layer on the substrate.

Tin oxide films of high quality may also be deposited in accordance with the third process embodiment of the present invention as described above, except using molecular oxygen under selected pressure and flow rate conditions as the oxygen-containing precursor.

While the present invention has been particularly described with the respect to the preferred embodiments thereof, it will recognized by those skilled in the art that certain modifications in form and detail may be made without departing from the spirit and scope of the invention. In particular, the scope of the invention is not limited to the photochemical vapor deposition of tin oxide, which was used merely as an example, but is intended to include the photochemical vapor deposition of any chosen conductive oxide from a selected gas phase metal-containing reactant that is capable of reacting with atomic oxygen to form an oxide In addition, the chemically unreactive oxygen-containing precursor is not limited to nitrous oxide, molecular oxygen under selected pressure and flow rate conditions, or nitrogen dioxide, but is intended to include any material which will photochemically dissociate to atomic oxygen, either with or without mercury sensitization. Further, the scope of the present invention is not limited to the use of mercury as the photosensitizing agent, but is intended to include other known photosensitizing and energy transfer agents, such as cadmium or zinc, and the use of the corresponding wavelength of the resonance line thereof to produce excitation of these photosensitizers. In addition, the process of the present invention is not limited to the specific operating conditions described herein, which were provided merely as examples In particular, the operating pressure may have a value higher or lower than the pressure specifically described herein.

Moreover, the scope of the present invention is not limited to the photochemical generation of atomic oxygen, which was used merely as an example, but is intended to include the use of any neutral, charge-free atomic oxygen which is generated in a manner that avoids the formation of charged particles or radiation which may damage the substrate. Further, the substrate on which oxide deposition may be performed by the process of the present invention is not limited to an oxide-coated silicon wafer, which was used herein as an example, but may include other semiconductor substrate materials (such as GaAs, HgCdTe, or InSb), electro-optical elements or components (such as lenses or mirrors, formed of a glass or plastic), GaAs or Si solar cells, or plastic materials, all of the foregoing being either with or without a layer of a second material formed on the surface thereof. In addition, the process of the present invention is not limited to films of transparent conductive oxides used for the purposes described herein, but includes the deposition of layers, films, or patterns of transparent and non-transparent conductive oxides for any purpose.

Finally, the process of the present invention is not limited to the particular apparatus described herein, which was used merely as an example, but is intended to include any apparatus suitable for conducting a photochemical reaction of the type described herein. The reaction chamber described herein may have any configuration in which at least a portion thereof is formed of quartz or other material which is transmissive to the selected wavelength of radiation and may comprise, for example, a hollow quartz tube. Further, the process of the present invention may be accomplished in an apparatus in which the source of selected radiation is contained within the reaction chamber, and a transmissive window is not needed.

What is claimed:

1. A process for depositing a layer of a conductive oxide of a chosen metal on the surface of a selected substrate while simultaneously avoiding damage to said substrate comprising exposing said substrate at a temperature within the range of about 30° C. to 300° C. to a selected vapor phase reactant containing said metal in the presence of neutral, charge-free oxygen atoms formed in a manner which avoids the generation of charged particles or high energy radiation, to bring about the reaction of said oxygen atoms with said vapor phase reactant to form said oxide which deposits as said layer on said substrate, while simultaneously avoiding said damage to said substrate due to said charged particles or said high energy radiation and minimizing thermal damage to said substrate.

2. The process set forth in claim 1 wherein said neutral, charge-free oxygen atoms are formed by the mercury photosensitized dissociation of a chosen chemically unreactive oxygen-containing precursor.

3. The process set forth in claim 1 wherein said neutral, charge-free oxygen atoms are formed by exposing a chosen chemically unreactive oxygen-containing precursor to radiation of a selected wavelength to cause the direct dissociation of said precursor to form said oxygen atoms.

4. The process set forth in claim 2 or 3 wherein said chemically unreactive oxygen-containing precursor is selected from the group consisting of: nitrous oxide ($N_2O$); nitrogen dioxide ($NO_2$); and molecular oxygen ($O_2$) under selected pressure and flow rate conditions.

5. The process set forth in claim 2 or 3 wherein:
(a) said vapor phase reactant is tetramethyl tin;
(b) said oxygen-containing precursor is nitrous oxide; and
(c) said oxide is tin oxide ($SnO_2$).

6. The process set forth in claim 2 or 3 wherein:
(a) said vapor phase reactant is trimethyl indium;
(b) said oxygen-containing precursor is nitrous oxide; and
(c) said oxide is indium oxide ($In_2O_3$).

7. The process set forth in claim 1 wherein said selected vapor phase reactant is selected from the group consisting of tetramethyl tin, tin chloride, trimethyl indium, dimethyl cadmium, and mixtures thereof.

8. The process set forth in claim 1 wherein said exposing further includes being performed in the presence of a second precursor containing selected dopant atoms and said oxide incorporates said dopant atoms.

9. The process set forth in claim 1 wherein said substrate is selected from the group consisting of a semiconductor material, a glass, and a plastic material.

10. The process set forth in claim 9 wherein said substrate has formed on the surface thereof a layer of a second chosen material.

11. A process for forming a layer of a conductive oxide of a chosen metal on the surface of a radiation-hardened substrate while maintaining the radiation-hardness of said substrate comprising exposing said substrate at a temperature within the range of about 30° C. to 300° C. to a selected vapor phase reactant containing said metal in the presence of neutral, charge-free oxygen atoms to bring about the reaction of said oxygen atoms with said vapor phase reactant to form said oxide which deposits on said surface of said substrate, said oxide being formed in a manner which avoids the generation of charged particles or high energy radiation that would degrate said radiation-hardness of said substrate.

12. The process set forth in claim 11 wherein said oxygen atoms are photochemically generated at a temperature sufficiently low so as to prevent thermal degradation of said radiation-hardness of said substrate.

13. A process for forming a chosen conductive oxide electrode member on the surface of a selected substrate comprising exposing said substrate at a temperature within the range of about 30° C. to 300° C. to a selected vapor phase reactant and neutral, charge-free oxygen atoms to bring about the reaction of said oxygen atoms with said vapor phase reactant to form said chosen conductive oxide which deposits as a layer on said surface of said substrate to thereby provide said electrode member.

14. The process set forth in claim 13 wherein said layer of said conductive oxide is deposited in a predetermined pattern.

15. The process set forth in claim 13 wherein said layer of said conductive oxide is subsequently altered to provide a predetermined pattern therein.

16. A process for depositing a layer of a conductive oxide of a chosen metal on the surface of a selected substrate comprising exposing said substrate at a temperature within the range of about 30° C. to 300° C. to a chosen vapor phase reactant containing said metal and a chosen oxygen-containing precursor in the presence of radiation of a selected wavelength in a manner sufficient to bring about a chemical reaction to form said conductive oxide which deposits as said layer on said substrate.

17. The process set forth in claim 16 wherein said exposing further includes the presence of a chosen photosensitizing agent.

* * * * *